United States Patent

Setsune et al.

[11] Patent Number: 4,610,894
[45] Date of Patent: Sep. 9, 1986

[54] METHOD OF MANUFACTURING SURFACE ACOUSTIC WAVE DEVICE

[75] Inventors: Kentaro Setsune, Sakai; Osamu Yamazaki, Toyonaka; Kiyotaka Wasa; Kazuo Tazuke, both of Nara, all of Japan

[73] Assignee: Matsushita Electric Industrial Co., Ltd., Osaka, Japan

[21] Appl. No.: 623,131

[22] Filed: Jun. 19, 1984

[30] Foreign Application Priority Data

Oct. 21, 1983 [JP] Japan ................. 58-197833

[51] Int. Cl.$^4$ ............................................. B05D 3/06
[52] U.S. Cl. ............................ 427/53.1; 204/192.32; 204/192.2; 204/192.22; 29/25.35; 331/73; 331/174
[58] Field of Search ............... 29/25.35; 331/73, 174; 427/53.1; 204/192 E, 192 D, 192 M

[56] References Cited

U.S. PATENT DOCUMENTS

| 4,364,016 | 12/1982 | Tanski ..................... | 29/25.35 X |
| 4,395,849 | 8/1983 | Kasai et al. ............... | 29/25.35 X |
| 4,442,574 | 4/1984 | Wanuga et al. ............. | 29/25.35 |
| 4,450,374 | 5/1984 | Cho et al. ................. | 29/25.35 X |

Primary Examiner—Thurman K. Page
Attorney, Agent, or Firm—Spencer & Frank

[57] ABSTRACT

In a method of manufacturing a surface-acoustic-wave device composed of, at least, a substrate through which a surface acoustic wave is propagated, the propagation velocity of the surface acoustic wave is adjusted by applying light directly to the surface of the substrate constituting the device or through a thin film of asymmetric lattice configuration deposited thereon by sputtering, the thin film having a thickness not exceeding a value of 0.03 times as large as the wavelength of the surface acoustic wave propagated through the substrate.

6 Claims, 5 Drawing Figures

METHOD OF MANUFACTURING SURFACE ACOUSTIC WAVE DEVICE

BACKGROUND OF THE INVENTION

The present invention relates to a method of manufacturing surface-acoustic-wave devices and, more particularly, to a method of manufacturing high-accuracy surface-acoustic-wave devices.

Surface-acoustic-wave devices are useful as high-accuracy solid-state filters, resonators and delay lines. In the manufacture of such surface-acoustic-wave devices, however, there are disadvantageously large variations in certain characteristics: for example, surface-acoustic-wave filters have a center frequency variation of 0.05% or larger. On the other hand, the latest information processing devices are required to reduce the center frequency variation to a value one order in magnitude smaller than the above-mentioned value. For this reason, surface-acoustic-wave devices are generally manufactured through selection. However, since manufacturing by such means as selection does not allow mass production of surface-acoustic-wave devices high in accuracy, there has been a strong demand for development of a highly accurate manufacturing process. The present invention aims at coping with this demand.

SUMMARY OF THE INVENTION

Accordingly, it is an object of the invention to easily obtain surface-acoustic-wave devices small in characteristic variation.

It is another object of the invention to easily obtain surface-acoustic-wave filters small in center frequency variation.

To these ends, according to the invention, there is provided a method of manufacturing a surface-acoustic-wave device composed, at least, of a substrate through which a surface acoustic wave is propagated, comprising the steps of applying light directly to the surface of the substrate or through a thin film of imperfect lattice configuration deposited thereon by sputtering or other deposition technique, the thin film having a thickness not exceeding 0.03 $\lambda$ ($\lambda$: wavelength of the surface-acoustic-wave), in order to vary the propagation velocity of the surface acoustic wave, thereby finely adjusting the operating frequency response of the surface-acoustic-wave device.

These and other objects, features and advantages of the invention will become clear from the following description of a preferred embodiment thereof taken in conjunction with the accompanying drawings.

DESCRIPTION OF PREFERRED EMBODIMENTS

The invention will be described hereinunder in detail with reference to the accompanying drawings.

Figure 1:
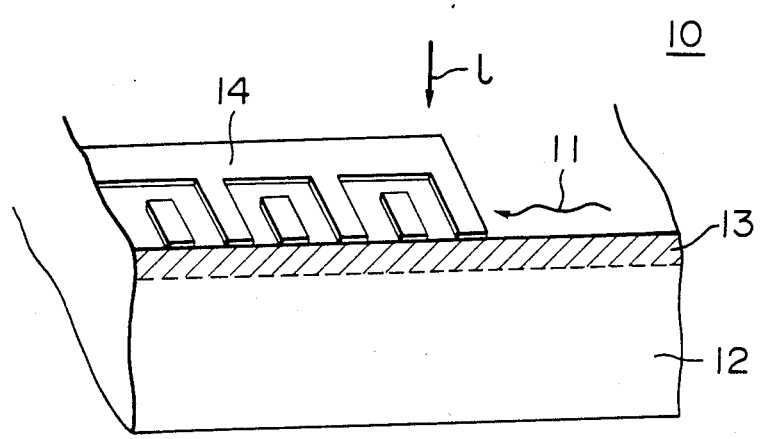
FIGS. 1 and 2 are perspective and sectional views, respectively, of an essential part of a surface-acoustic-wave device for describing the invention.

FIG. 1 shows the construction of an essential part of a surface-acoustic-wave device 10 as an aid for explaining the method of manufacturing high-accuracy surface-acoustic-wave devices in accordance with the invention.

Referring to FIG. 1, according to the invention, a machined surface layer 13 of a substrate 12 having a pair of interdigital electrodes 14 formed thereon is irradiated with light 1 with a short wavelength, e.g., light emitted from a mercury-arc lamp, to vary the propagation velocity of a surface acoustic wave 11, thereby obtaining a surface-acoustic-wave device which is small in characteristic variation and has a desired propagation velocity.

The frequency characteristic of a surface-acoustic-wave device, e.g., the center frequency $f_o$ of a surface-acoustic-wave filter, is generally determined by the relationship, $f_o = v/\lambda$ (v: propagation velocity of a surface acoustic wave). In this case, $\lambda$ is determined by, for example, the geometric dimensions of interdigital electrodes for exciting the surface acoustic wave, and it is easy to form the electrodes into their design dimensions. Accordingly, the problem in manufacturing this kind of device is variations of $f_o$ due to differences in surface-acoustic-wave propagation velocity v between the substrates prepared. Substrates for the devices have center frequency variations on the order of one several thousandths even if they are produced by employing a single crystal material with care being taken that they are coincident with each other in the cut surface configuration and the surface-acoustic-wave propagation direction. The variations cannot easily be reduced by ordinary techniques. For example, if it is intended to obtain surface-acoustic-wave filters with a center frequency of 600 MHz, it is only possible to manufacture them with center frequency variations on the order of 300 to 600 KHz. Therefore, it has conventionally been difficult to manufacture surface-acoustic-wave filters usable for television signal converters and the like.

The present invention has been accomplished on the basis of an experimental discovery, as the result of detailed examination of the center frequency variation, that the variation is attributable to the extremely thin machined surface layer 13 formed on the surface of the substrate 12 by machining the same or by the steps of cutting and polishing the substrate 12, and moreover, that the irradiation of the machined surface layer with light having a short wavelength reduces minute defects in the machined surface layer through a kind of annealing action; consequently, the substrate surface becomes fine in structure, resulting advantageously in an increase in the center frequency $f_o$.

Figure 2:
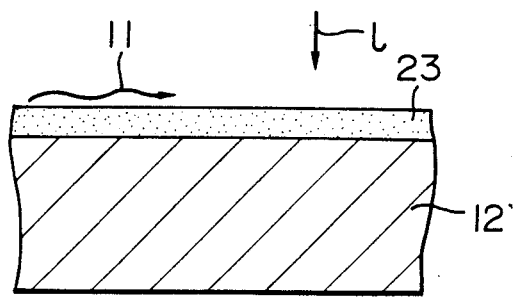

Further, the present invention is based on the discovery made by the present inventors that the center frequency $f_o$ can be adjusted, as shown in FIG. 2, by applying light to the substrate surface constituting a surface-acoustic-wave propagation path, through a thin film deposited thereon by, for example, sputtering with the substrate being maintained at room temperature, the thin film being of asymmetric lattice configuration in which crystallization has not well proceeded yet (this kind of thin film is often found in the course of growth of a thin film when it is formed in an evaporation process, for example).

Figure 3:
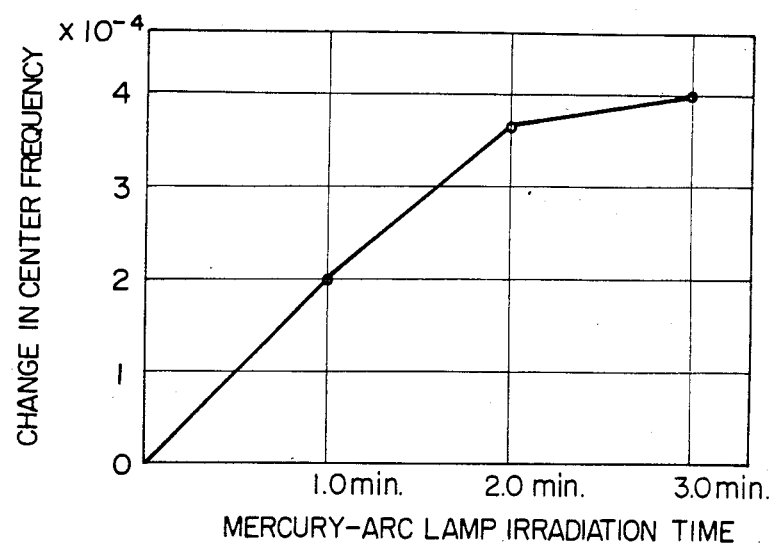
FIGS. 3, 4 and 5 are characteristic curve charts for describing advantageous effects offered by the invention.

When a surface-acoustic-wave device with a center frequency of 600 MHz formed on the rock crystal substrate 12 having the machined surface layer 13 formed thereon, shown in FIG. 1, was irradiated with light 1 from a position 10 cm away therefrom by means of a high-pressure mercury-arc lamp of 250 W, a center frequency increase of 120 KHz per minute was observed as shown in FIG. 3. The change in center frequency was substantially proportional to the irradiation time but was saturated in about three minutes. Next, an experiment similar to the above was carried out with an infrared ray by means of a halogen lamp. In this case, although a change in propagation velocity was recognized, at the same time, a large change was measured in frequency temperature characteristic due to heating. Further, a similar experiment was performed by means of a sterilization lamp of 15 W as a low-pressure mercury-arc lamp. In this case, since it was difficult to condense light due to the fact that the light emitted from the sterilization lamp has a short wavelength, the surface-acoustic-wave device was placed at a position about 5 mm away from the outer wall of the sterilization lamp. As a result, a permanent change in frequency similar to that in the high-pressure mercury-arc lamp was observed although it took a period of time about fifty times as much as that required in the case of the high-pressure mercury-arc lamp. Despite the fact that the low-pressure mercury-arc lamp has a much lower intensity of applied light than the high-pressure mercury-arc lamp, the low-pressure mercury-arc lamp changed the propagation velocity of the substrate.

From the above, it has been found that it is possible to adjust the frequency by irradiation with light, and a great effect is offered by light with a short wavelength, particularly that which does not exceed 5,000 Å, especially light having spectrum between 2,000 Å and 3,000 Å, such as light emitted from a low-pressure mercury-arc lamp. It may be understood that although the rock crystal substrate 12 must be transparent to light with a wavelength not exceeding 1,200 Å, microscopic defective portions in the machined surface layer 13 also absorb light with wavelengths slightly closer to the long-wavelength side and are annealed at the time of absorption of such light.

The invention will be described hereinunder through practical examples.

A pair of interdigital electrodes 14 (line width, 1.2 μm; number of pairs of interlocking fingers, 150; and electrode film thickness, 500 Å) of a deposited Al film were formed on the surface of the ST cut rock crystal substrate 12. A delay line type surface-acoustic-wave oscillator was formed by employing a surface-acoustic-wave filter constituted by the surface-acoustic-wave device having the electrode pair 14 as input/output electrodes thereof. The delay line type surface-acoustic-wave oscillator was constructed by installing a high-frequency amplifier between the input and output electrodes. The oscillation frequency was measured by means of a frequency measuring device. At the beginning, the surface-acoustic-wave device employed in the experiment had a center frequency 150 kHz lower than the target center frequency of 600 MHz. As the result of irradiation with light by a high-pressure mercury-arc for about 70 seconds, however, it was possible to obtain the desired center frequency. In such case, it is convenient to obtain the desired center frequency while reading the frequency having the oscillation continued even during the irradiation, and it is thereby advantageously possible to increase the frequency accuracy and precision.

FIG. 2 shows an embodiment of the invention in which a thin film is formed on a rock crystal substrate.

Figure 4:
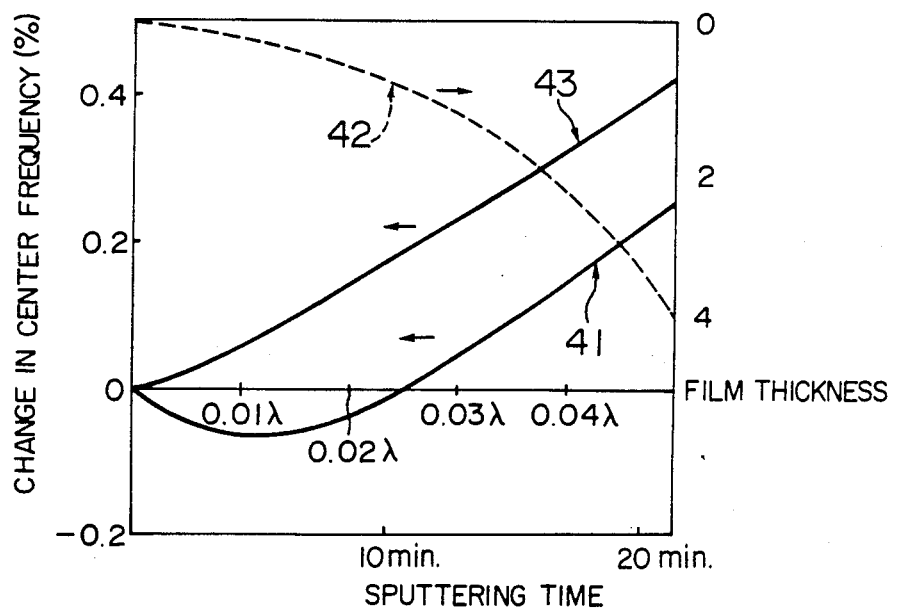

Referring to FIG. 4, a curve 41 represents the relationship between the sputtering time and the center frequency $f_o$ in the case where an $SiO_2$ thin film 23 of asymmetric lattice configuration is formed along the surface-acoustic-wave propagation path of a surface-acoustic-wave filter formed on the rock crystal substrate 12. The curve 41 shows that the change in $f_o$ converts from negative to positive in accordance with the sputtering time. In addition, the curve 41 shows that the employment of the change of the center frequency $f_o$ permits $f_o$ to be adjusted in either the positive or negative directions, as desired, by the selection of the sputtering time.

If the film thickness exceeds 0.03 λ, for example, due to an excessively long sputtering time, as shown by a curve 42, the insertion loss increases above 1 dB, which creates a problem in ordinary circuit design; therefore, a thin film with such large thickness is not suitable for practical use. It is to be noted that in this device structure the relationship between the center frequency $f_o$ and the thickness of the $SiO_2$ thin film is theoretically considered to be such that $f_o$ constantly increases with respect to the film thickness as shown by a curve 43 in FIG. 4. Accordingly, the conversion of $f_o$ on the curve 41 of FIG. 4 from negative to positive (i.e., existence of a minimum point) is not found in an ordinary thin film of symmetric lattice configuration, and this conversion is a feature of the thin film of imperfect lattice configuration in accordance with the invention.

The present inventors have found that, in a method of manufacturing surface-acoustic-wave devices of this kind, when the surface of a thin film of imperfect lattice configuration deposited on a substrate by evaporation is irradiated with light, e.g., a laser beam 1, the center frequency $f_o$ changes and the $f_o$ change can be accurately controlled by properly selecting the intensity of the light. Thus, the inventors have invented a process in which high-accuracy surface-acoustic-wave devices, e.g., surface-acoustic-wave filters and oscillators can be formed with an excellent reproducibility by the above-described light irradiation.

Figure 5:
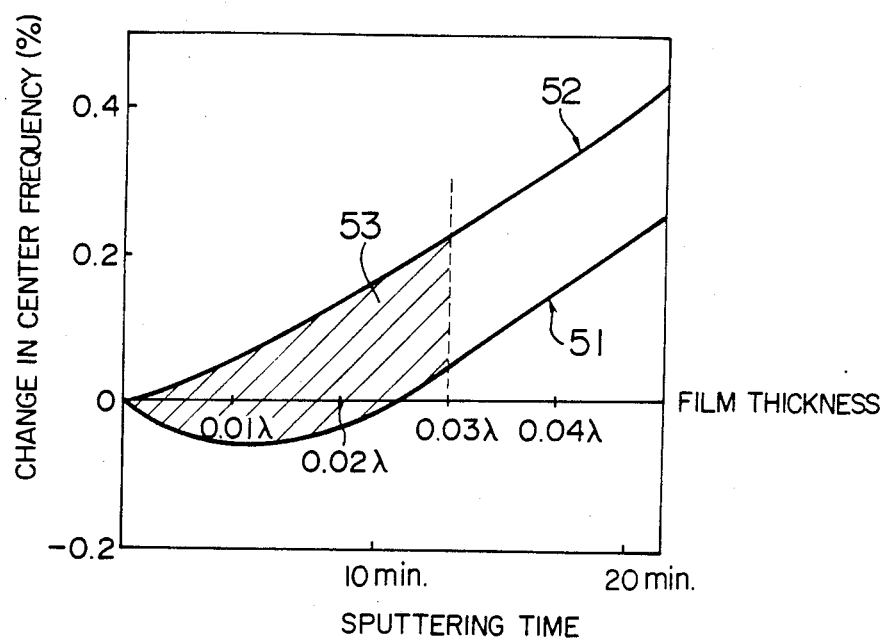

Curves 51, 52 of FIG. 5 show an effect offered by an embodiment of the invention. More specifically, the curve 51 represents the change in the center frequency $f_o$ with respect to the sputtering time in the case where a $SiO_2$ thin film of imperfect lattice configuration containing $SiO_2$ as its principal component is deposited on the surface of a rock crystal substrate by sputtering, for example. When the thin film surface is irradiated with a $CO_2$ infrared laser beam (10.7 μm), $f_o$ increases, and if the irradiation is effected for a long period of time, the curve 51 converges on the curve 52. Accordingly, it has been found that the adjustment of the irradiation time of the laser beam makes it possible to obtain a device showing any desired $f_o$ within the zone 53 between the curves 51 and 52. The inventors have also confirmed that the laser beam irradiation not only permits the adjustment of $f_o$ but also provides an annealing effect and therefore is effective in improvement of surface-acoustic-wave devices in long-term stability.

It is to be noted that it has been confirmed by the inventors that it is possible to employ as the light source for the irradiation a YAG laser (1.06, 1.32 μm) such as for example, the above-described $CO_2$ infrared laser, and it is also possible to employ an ultraviolet laser, such as for example, an Ar laser (0.4 μm) or an excimer laser (0.2 to 0.4 μm), or an ultraviolet light source such as, for example, a halogen lamp or mercury-arc lamp.

Moreover, the combination of the material for the substrate and the material for the thin film of imperfect lattice configuration is not limited to that in the above-described embodiment.

To further facilitate the understanding of the advantageous effects offered by the invention, it will be described hereinunder through a couple of practical examples.

REFERENCE EXAMPLE 1

A pair of interlocking comb-shaped electrodes 14 (line width, 1.2 μm; number of pairs of interlocking fingers, 150; and electrode film thickness, 500 Å) of a deposited Al film were formed on the surface of the ST cut rock crystal substrate 12. A delay line type surface-acoustic-wave oscillator was formed by employing a surface-acoustic-wave filter having the electrode pair 14 as input/output electrodes. As a result, the oscillation frequency was 674.4 MHz, which has a deviation of 0.4 MHz from a desired frequency. Subsequently, a quartz target was sputtered in argon gas by means of a magnetron sputtering apparatus for one minute to form a thin film having $SiO_2$ as its principal component on a propagation path constituted by the substrate 12. During the evaporation, the device temperature was maintained at 30° C. As a result, it was possible to obtain an oscillation frequency of 674 MHz (the desired value). The quartz thin film thickness was 100 Å. It is to be noted that it was confirmed that the control of the sputtering time makes it possible to obtain a frequency accuracy of ±50 kHz in mass production.

REFERENCE EXAMPLE 2

The device formed in Example 1 was further irradiated with an excimer laser (0.295 μm). In this case, it was possible to obtain a desired frequency with a laser power of 0.5 W and an irradiation time of 30 seconds. In this case, it was confirmed that it is possible to obtain a frequency accuracy of ±20 kHz in mass production by irradiating the device with the laser beam while monitoring the oscillation frequency of the device. Further, the device having undergone a heat cycle test (−20° C. to 100° C.) showed no change in characteristics at all, and it was thus confirmed that the device manufactured by the method of the invention is high in reliability.

REFERENCE EXAMPLE 3

A thin film 23 having $SiO_2$ as its principal component was formed on the surface of a substrate 12 of multilayer structure which was constituted by a ZnO thin film and sapphire by sputtering a quartz target by means of a magnetron sputtering apparatus for one minute similarly to Example 1. The oscillation frequency in this case was 914.9 MHz. The change in frequency in accordance with the thickness of the thin film 23 was 400 kHz/100 Å. This device was irradiated with $CO_2$ laser (10.7 μm) to adjust the frequency to 915 MHz as a desired value. The laser power was 5 W, while the irradiation time was 0.75 second.

As will be clear from the above description, the manufacturing process of the invention advantageously makes it possible to easily produce high-accuracy surface-acoustic-wave devices. The invention offers a great industrial advantage, since it is possible to adjust the propagation velocity to a desired value and to match the frequency with a desired frequency even after the electrodes are thus formed or after the device is incorporated in a circuit. The frequency adjustment can be effected even after the device is incorporated in a circuit or apparatus, provided that a container such as an EPROM (a memory in which stored data can be erased by ultraviolet light) is used.

Although the thin film of asymmetric lattice configuration is formed by sputtering in the above-described embodiment, the sputtering is not exclusive and it suffices that the deposited thin film has a disordered lattice configuration. As the deposition technique, it is possible to employ ion-beam sputtering, electron-beam evaporation, chemical vapor deposition (CVD) or plasma CVD. In addition, the light source for the irradiation is not limited to a laser beam source. In short, it is only required for the energy density to exceed a predetermined value. Accordingly, it is also possible to employ an ultraviolet lamp or infrared lamp by condensing the light emitted therefrom.

Further, although the thin film of imperfect lattice configuration is laminated on a piezoelectric substrate, e.g., rock crystal, in the above-described embodiment, the piezoelectric substrate is not exclusive and the invention offers a similar advantageous effect, provided that the thin film is laminated on a substrate which allows a surface acoustic wave to be propagated along the surface thereof. Accordingly, a delay line having a propagation path constituted by, for example, a nonpiezoelectric substrate, such as a glass substrate, only requires lamination of a thin film of imperfect lattice configuration on the glass substrate.

Furthermore, the invention is not limited to the manufacture of the surface-acoustic-wave filter or delay line described in the embodiment. The invention is effective in formation of any kind of surface-acoustic-wave device including surface-acoustic-wave resonators, in addition to surface-acoustic-wave filters and delay lines, and therefore has a great industrial value.

What is claimed is:

1. A method of manufacturing a surface-acoustic-wave device including a substrate having a surface and interdigital electrodes formed on the surface, said method comprising:
    depositing, by evaporation, a thin film of imperfect lattice configuration on the surface of the substrate, the thin film having a thickness not exceeding 0.03λ, wherein λ is the wavelength of the surface acoustic wave; and
    applying, after said depositing step, light having a wavelength not exceeding 5000 Å to the surface of the substrate through which a surface acoustic wave is propagated, causing the surface of the subtstrate to have a more fine structure so as to vary the propagation velocity of the surface acoustic wave and thereby finely adjust the operating frequency of the surface-acoustic-wave device.

2. A method of manufacturing a surface-acoustic-wave device according to claim 1, wherein said depositing step comprises forming the thin film of imperfect lattice configuration by sputtering.

3. A method of manufacturing a surface-acoustic-wave device according to claim 1, wherein said applying step is performed after interdigital electrodes are formed on the substrate.

4. A method of manufacturing a surface-acoustic-wave devices according to claim 1, wherein rock crystal is employed as the substrate.

5. A method of manufacturing a surface-acoustic-wave device according to claim 1, wherein said applying step includes employing one of a high-pressure mercury-arc lamp, a low-pressure mercury-arc lamp and an ultraviolet laser, or a combination thereof as a light source for the light.

6. A method of manufacturing a surface-acoustic-wave device according to claim 1, wherein said applying step comprises applying light having a wavelength between 2000 Å and 3000 Å to the surface of the substrate.

* * * * *